(12) United States Patent
Park

(10) Patent No.: US 6,248,636 B1
(45) Date of Patent: *Jun. 19, 2001

(54) METHOD FOR FORMING CONTACT HOLES OF SEMICONDUCTOR MEMORY DEVICE

(75) Inventor: Jae-kwan Park, Suwon (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/086,762

(22) Filed: May 28, 1998

(51) Int. Cl.[7] .................. H01L 21/336; H01L 21/76; H01L 21/331; H01L 21/311
(52) U.S. Cl. .................. 438/296; 438/424; 438/359; 438/700
(58) Field of Search .................. 438/424, 296, 438/359, 700

(56) References Cited

U.S. PATENT DOCUMENTS

| | | | |
|---|---|---|---|
| 4,371,423 | * | 2/1983 | Yoshizawa et al. . |
| 5,538,922 | * | 7/1996 | Cooper et al. . |
| 5,726,100 | * | 3/1998 | Givens . |
| 5,843,816 | * | 12/1998 | Liaw et al. . |
| 5,858,877 | * | 1/1999 | Dennison et al. . |
| 5,866,465 | * | 2/1999 | Doan et al. . |
| 5,895,250 | * | 4/1999 | Wu . |
| 5,946,569 | * | 8/1999 | Huang . |

* cited by examiner

Primary Examiner—John F. Niebling
Assistant Examiner—Josetta I. Jones
(74) Attorney, Agent, or Firm—Marger Johnson & McCollom, P.C.

(57) ABSTRACT

A novel method for forming contact holes is disclosed. According to the present invention, a silicon substrate is prevented from being over-etched by performing a two-step etching process. The first step is to etch a thick interlayer insulating layer until a thin etch stopper layer, formed beneath the interlayer insulating layer, is exposed. The second step is to over-etch the thin etch stopper layer. With this method, a lower capacitor electrode or a bit line can be prevented from being short-circuited with a well region of the silicon substrate, thereby reducing leakage currents.

20 Claims, 4 Drawing Sheets

METHOD FOR FORMING CONTACT HOLES OF SEMICONDUCTOR MEMORY DEVICE

FIELD OF THE INVENTION

The present invention relates to a method for fabricating a semiconductor memory device, and more particularly to a method for forming contact holes of a semiconductor memory device.

BACKGROUND OF THE INVENTION

FIG. 1 shows a lay-out of a conventional semiconductor memory device. A word line 100 is arranged perpendicularly to an active region 200. A contact hole 300 for a lower capacitor electrode and a contact hole 400 for a bit line are each formed between word lines. During formation of the contact holes 300 and 400, misalignment can cause deviation of the contact holes from active regions 200. Because of such deviation, a silicon substrate 1 can be over-etched more than necessary during the formation of the contact holes 7 and 7a (i.e., during etching of a very thick interlayer insulating layer 5) as shown by dotted circles A and A' of FIGS. 2 and 3. If the over-etching reaches a well region (e.g., silicon region) of silicon substrate 1, a lower capacitor electrode or a bit line to be formed by following process steps is short-circuited with the well region. In addition, leakage currents can be increased because of the over-etching.

Accordingly, a need remains for a method for forming contact holes without causing the over-etching problem.

SUMMARY OF THE INVENTION

Accordingly, it is an object of the invention to provide a method for forming contact holes which can prevent a silicon substrate from being over-etched in order that a capacitor electrode or a bit line is not short-circuited with a well region in the silicon substrate.

According to an aspect of the present invention, a method for forming a contact hole comprises the steps of etching a silicon substrate using a trench forming mask to form a trench therein; filling the trench with a first insulating layer to form an isolation trench; forming a second insulating layer over the silicon substrate including the isolation trench; forming an etch stopper layer on the second insulating layer; forming a third insulating layer on the etch stopper layer; etching the third insulating layer until the etch stopper layer is exposed, to form an opening; and sequentially etching the etch stopper and second insulating layers within the opening to form a contact hole.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

Figure 1:
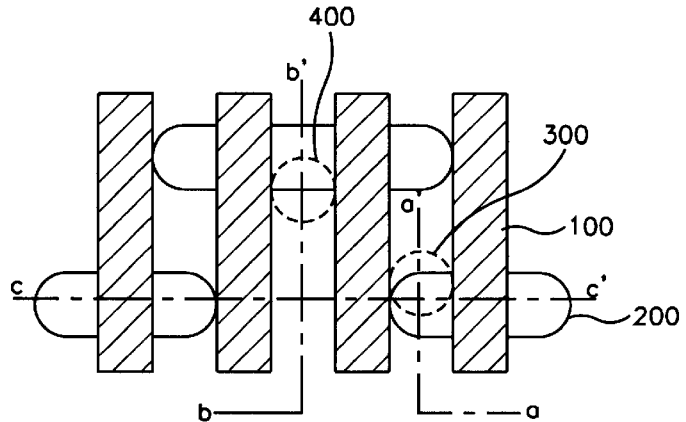
FIG. 1 shows a schematic layout of a typical semiconductor memory device used to explain the present invention.
Figure 2:
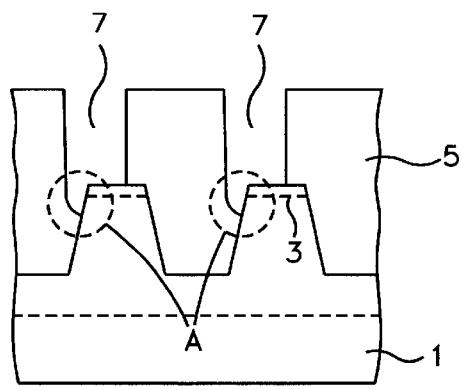
FIG. 2 is a cross-sectional view of the semiconductor memory device taken along the line a–a' of FIG. 1.
Figure 3:
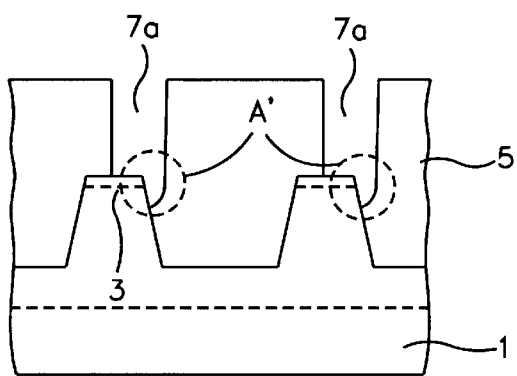
FIG. 3 is a cross-sectional view of the semiconductor memory device taken along the line b–b' of FIG. 1.

FIGS. 4A through 4J illustrate the process steps for fabricating a semiconductor memory device by cross-sectional views in accordance with the present invention. In these figures, a reference symbol "B" denotes a cross-sectional view of the semiconductor memory device taken along line b–b' of FIG. 1. A reference symbol "C" denotes a cross-sectional view of the semiconductor memory device taken along line c–c' of FIG. 1. The memory device that is completed according to the present invention has a layout substantially similar to the layout of the conventional memory device shown in FIG. 1.

According to the present invention, during the formation of contact holes, the over-etching of a silicon substrate can be prevented using a two-step etching process. The first step is to etch a thick interlayer insulating layer until a thin etch stopper layer, formed beneath the interlayer insulating layer, is exposed. The second step is to over-etch the thin etch stopper layer.

Figure 4A:
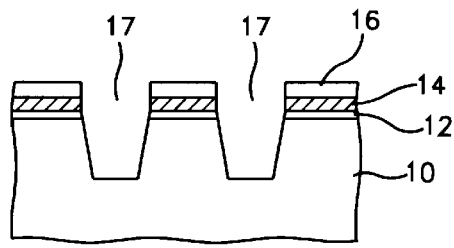
FIGS. 4A through 4J are cross-sectional views showing the process steps for fabricating a semiconductor memory device according to the present invention.

Referring to FIG. 4A, a pad oxide layer 12 and a silicon nitride layer (e.g., a layer $Si_3N_4$) 14 are sequentially formed on a silicon substrate 10. Then a pattern of an oxide layer 16 is formed on the silicon nitride layer 14. Next an etching process is performed, using the oxide pattern 16 as a mask, to form a trench 17. The pad oxide layer 12 is about 200 Å in thickness, and each of the silicon nitride layer 14 and the oxide pattern 16 is about 1000 Å in thickness.

Figure 4B:
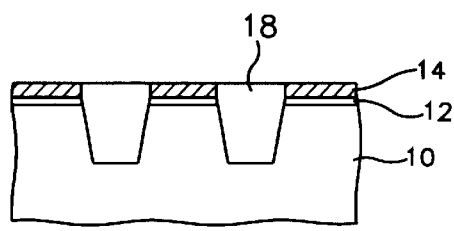
Figure 4C:
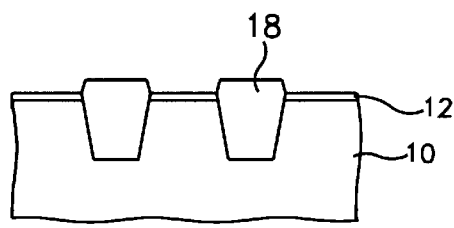

As shown in FIG. 4B, an oxide layer having a thickness of about 7000 Å fills the trench 17. Then a CMP (chemical mechanical polishing) process is carried out so that an isolation trench 18 can be formed. During the CMP process, the silicon nitride layer 14 is used as an etch stopper layer. After formation of the trench isolation 18, the silicon nitride layer 14 is stripped as shown in FIG. 4C.

Figure 4D:
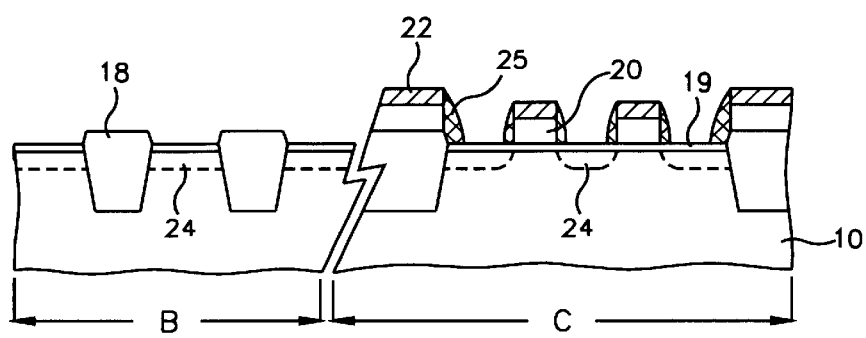

Subsequently, after removal of the pad oxide layer 12, a gate oxide layer 19 is formed on the silicon substrate 10. Then a gate structure is formed as shown in FIG. 4D. The gate structure includes a gate electrode 20 having a thickness of about 1000 Å and an insulating layer (e.g., silicon nitride layer) 22 formed on the gate electrode 20. Next, an $n^-$ type impurity implantation is performed, using the gate structure as a mask, to form an $n^-$ type doping region 24 in the silicon substrate 10. A silicon nitride layer having a thickness of about 1000 Å is also formed on the semiconductor and is dry-etched to form a spacer 25 on both the sidewalls of the gate structure.

Figure 4E:
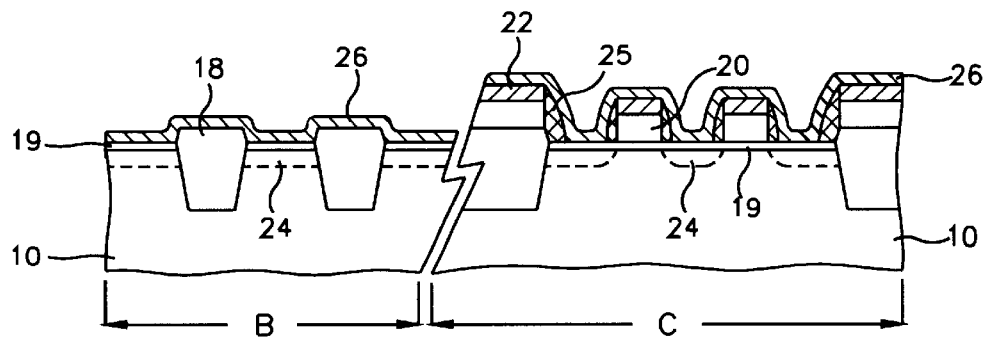

Referring to FIG. 4E, a silicon nitride layer 26 having a thickness of about 300 Å is deposited over the silicon substrate including the isolation trench 18 and the gate structure. Here, it is important that the silicon nitride layer 26 is used as an etch stopper layer during formation of contact holes to be formed.

Figure 4F:
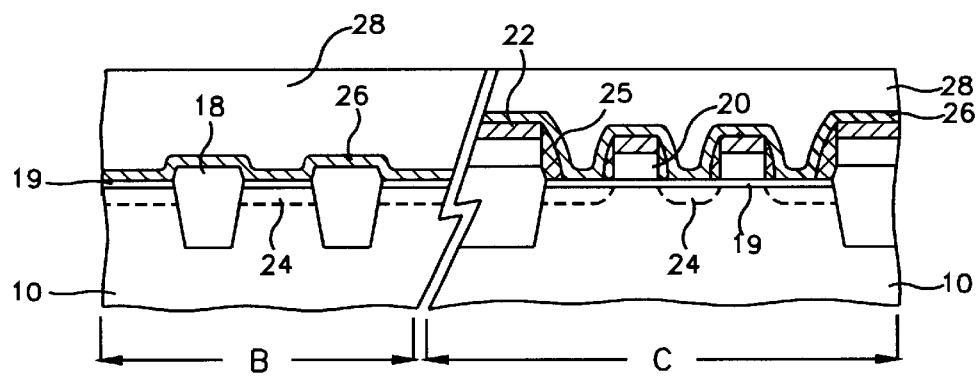

Next, as shown in FIG. 4F, a thick interlayer insulating layer 28 is formed over the silicon nitride layer 26, and is planarized. The interlayer insulating layer 28 formed thus has an upper surface to be planarized.

Figure 4G:
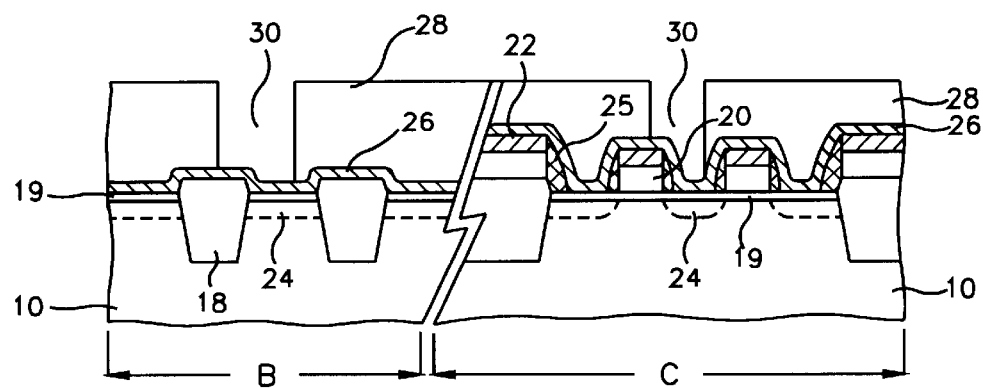

In FIG. 4G, conventional photolithographic and etching process steps are performed to form an opening 30 in the interlayer insulating layer 28. During the etching process of the interlayer insulating layer 28, the silicon nitride layer 26 is used as an etch stopper because the interlayer insulating layer 28 has a relatively high etch selectivity to the silicon nitride layer 26.

Figure 4H:
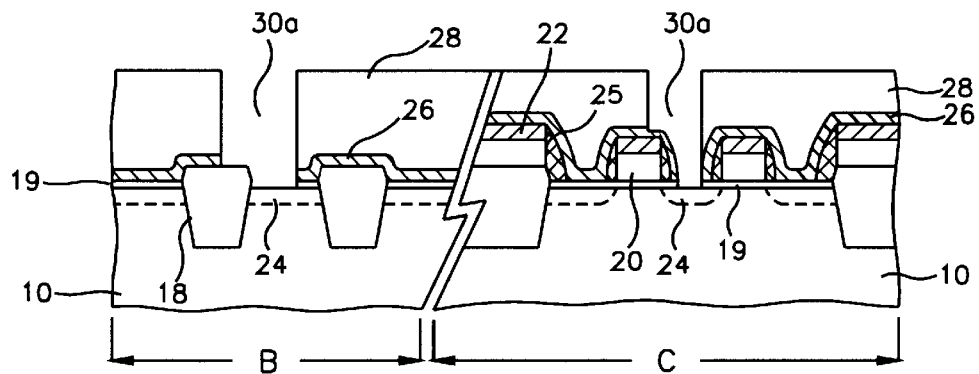

With reference to FIG. 4H, the silicon nitride layer 26 in the opening 30 is removed and then the gate oxide layer 19 therein is over-etched until a surface of the silicon substrate 10 is completely exposed. As a result, a contact hole 30a is formed. Here, the over-etching is performed only for the gate oxide layer 19 having a thickness of about 100 Å. Thus, it is very easy to control the over-etching of the gate oxide layer 19 compared to the relatively thick interlayer insulating layer 28.

Also, even if the etch selectivity of the silicon nitride layer 26 with respect to the gate oxide layer 19 is 1:1, so as to simplify process steps, the over-etching toward the gate oxide layer 19 can be minimized according to the present invention. So, during the over-etching of the gate oxide layer 19, the over-etching of the silicon substrate may also be minimized.

Figure 4I:
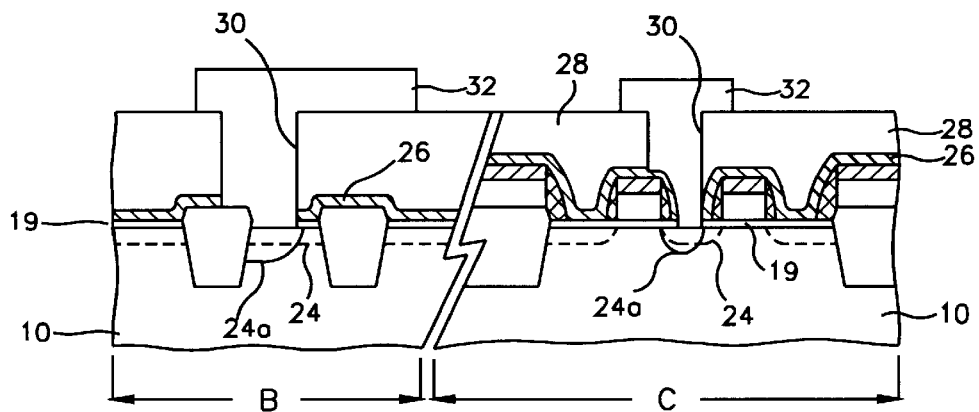

Referring to FIG. 4I, impurities are injected through the contact hole 30a into the silicon substrate 10 to form a plug region 24a so as to increase doping concentration of the doping region 24. Next, a polysilicon layer fills the contact hole 30a and is then patterned to form the pad electrode 32.

Figure 4J:
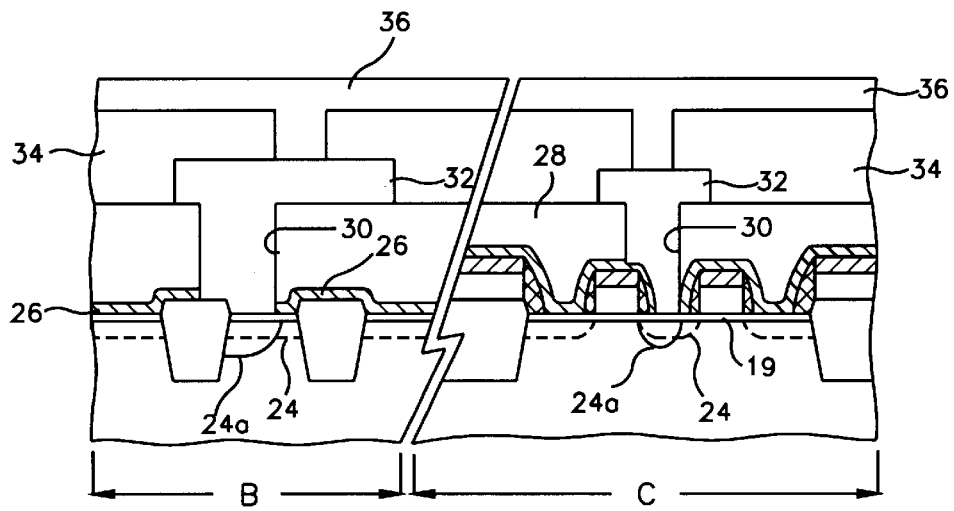

Finally, as shown in FIG. 4J, an interlayer insulating layer 34 is formed over the silicon substrate including the pad electrode 32 and then patterned to form a contact hole in the interlayer insulating layer 34. A conductive layer is deposited on the interlayer insulating layer 34, filling up the contact hole. As a result, a bit line 36 is formed.

In this embodiment, it is illustrated that the pad electrode 32 is formed also in the contact hole at the "C" region. However, a lower capacitor electrode (i.e., a storage electrode of a capacitor) may be formed instead of the pad electrode 32 in the contact hole of the "C" region.

As described above, according to the method of the present invention, a silicon substrate is prevented from being over-etched by using a two-step etching process, one of which is to etch a thick interlayer insulating layer until a thin etch stopper layer formed beneath the interlayer insulating layer is exposed, and the other of which is to over-etch the thin etch stopper layer. Accordingly, a semiconductor memory device formed according to the present invention can prevent a lower capacitor electrode (i.e., a plate electrode) or a bit line from being short-circuited with a well region of the silicon substrate, thereby reducing leakage currents.

What is claimed is:

1. A method for forming a contact hole for a semiconductor device, comprising:

forming a first insulating layer over a silicon substrate with isolation structures;

forming an etch stopper layer on the first insulating layer;

forming a second insulating layer on the etch stopper layer;

etching the second insulating layer until the etch stopper layer is exposed, to form an opening; and sequentially etching the exposed etch stopper and first insulating layers within the opening to form a contact hole exposing the silicon substrate, wherein an etch selectivity of the etch stopper layer with respect to the first insulating layer is substantially 1:1.

2. The method according to claim 1, wherein the thickness of the etch stopper layer is substantially less than the depth of the contact hole.

3. The method according to claim 1, further comprising, after forming the first insulating layer:

forming gate structures overlying the silicon substrate between the isolation structures; and forming a spacer on a sidewall of the gate structures, wherein the etch stopper layer is formed over the gate structures and the spacer.

4. The method according to claim 3, wherein the step of forming a gate structure comprises:

sequentially forming a conductive layer and an insulting layer over the first insulating layer; and patterning the insulating layer and the conductive layer.

5. The method according to claim 4, wherein the insulating layer is formed of silicon nitride.

6. The method according to claim 1, wherein said first insulating layers is formed of oxide and said isolation structures are formed of oxide.

7. The method according to claim 1, wherein said second insulating layer functions as an interlayer insulating layer which is relatively thick compared to the etch stopper layer.

8. The method according to claim 1, wherein the method further comprises, after formation of the contact hole, forming a pad electrode for a bit line and a pad electrode for a capacitor.

9. The method according to claim 1, wherein the method further comprises, after formation of the contact hole, forming a storage electrode of a capacitor.

10. The method according to claim 1, wherein said second insulating layer has relatively high etch selectivity to the etch stopper layer.

11. A method for forming a contact hole for a semiconductor device, comprising:

forming a first insulating layer over a silicon substrate with isolation structures;

forming an etch stopper layer on the first insulating layer;

forming a second insulating layer on the etch stopper layer;

etching the second insulating layer until the etch stopper layer is exposed, to form an opening; and sequentially etching the exposed etch stopper and first insulating layers within the opening to form a contact hole exposing the silicon substrate, wherein said contact hole is formed by over-etching.

12. The method according to claim 11, wherein the thickness of the etch stopper layer is substantially less than the depth of the contact hole.

13. The method according to claim 11, further comprising, after forming the first insulating layer:

forming gate structures overlying the silicon substrate between the isolation structures; and forming a spacer on a sidewall of the gate structures, wherein the etch stopper layer is formed over the gate structures and the spacer.

14. The method according to claim 13, wherein the step of forming a gate structure comprises:

sequentially forming a conductive layer and an insulting layer over the first insulating layer; and patterning the insulating layer and the conductive layer.

15. The method according to claim 14, wherein the insulating layer is formed of silicon nitride.

16. The method according to claim 11, wherein said first insulating layers is formed of oxide and said isolation structures are formed of oxide.

17. The method according to claim 11, wherein said second insulating layer functions as an interlayer insulating layer which is relatively thick compared to the etch stopper layer.

18. The method according to claim 11, wherein the method further comprises, after formation of the contact hole, forming a pad electrode for a bit line and a pad electrode for a capacitor.

19. The method according to claim 11, wherein the method further comprises, after formation of the contact hole, forming a storage electrode of a capacitor.

20. The method according to claim 11, wherein said second insulating layer has relatively high etch selectivity to the etch stopper layer.

* * * * *

UNITED STATES PATENT AND TRADEMARK OFFICE
CERTIFICATE OF CORRECTION

PATENT NO. : 6,248,636 B1
DATED : June 19, 2001
INVENTOR(S) : Park

It is certified that error appears in the above-identified patent and that said Letters Patent is hereby corrected as shown below:

Column 3,
Line 8, "FIG. 41" should read -- FIG. 4I --.
Line 31, "plate" should read -- storage --.

Signed and Sealed this

Tenth Day of September, 2002

Attest:

JAMES E. ROGAN
Attesting Officer  Director of the United States Patent and Trademark Office